United States Patent
Miyashita (10) Patent No.: US 7,852,477 B2
(45) Date of Patent: Dec. 14, 2010

(54) CALCULATION METHOD AND APPARATUS OF EXPOSURE CONDITION, AND EXPOSURE APPARATUS

(75) Inventor: Tomoyuki Miyashita, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 762 days.

(21) Appl. No.: 11/753,721

(22) Filed: May 25, 2007

(65) Prior Publication Data
US 2007/0275313 A1 Nov. 29, 2007

(30) Foreign Application Priority Data
May 26, 2006 (JP) .............................. 2006-147230

(51) Int. Cl.
G01B 11/00 (2006.01)
G01B 11/24 (2006.01)
G03B 27/42 (2006.01)
G03C 5/00 (2006.01)

(52) U.S. Cl. .................... 356/390; 356/603; 439/30; 355/53

(58) Field of Classification Search ................. 356/124, 356/124.5, 600–623; 430/30, 311, 22; 355/53, 355/55, 67; 382/286, 112, 305; 359/388–394
See application file for complete search history.

(56) References Cited

U.S. PATENT DOCUMENTS

| | | | | |
|---|---|---|---|---|
| 4,645,338 A | * | 2/1987 | Juliana et al. | 356/150 |
| 4,980,716 A | * | 12/1990 | Suzuki et al. | 396/104 |
| 6,376,139 B1 | * | 4/2002 | Fujisawa et al. | 430/30 |
| 6,519,024 B2 | * | 2/2003 | Hirano | 355/55 |
| 7,018,932 B2 | | 3/2006 | Ito et al. | |
| 7,385,672 B2 | * | 6/2008 | Shinoda | 355/53 |
| 2003/0104292 A1 | | 6/2003 | Tomimatu | |
| 2005/0188341 A1 | * | 8/2005 | Fukuhara et al. | 716/19 |
| 2006/0056733 A1 | * | 3/2006 | Minakuti et al. | 382/286 |
| 2007/0154824 A1 | * | 7/2007 | Sentoku et al. | 430/30 |

FOREIGN PATENT DOCUMENTS

| | | |
|---|---|---|
| JP | 02-157844 | 6/1990 |
| JP | 2002-216077 | 8/1990 |
| KR | 2003-0047690 A | 6/2003 |
| KR | 2003-0072245 A | 9/2003 |
| WO | 02/29870 | 4/2002 |

* cited by examiner

Primary Examiner—Sang Nguyen
(74) Attorney, Agent, or Firm—Rossi, Kimms & McDowell LLP (57) ABSTRACT

A method for calculating a correction amount to a focus amount or an exposure dose in exposing a substrate with an exposure apparatus includes a storing step of storing plural sets, each of which is a combination of a set focus amount, a set exposure dose, and first image information of a pattern formed on the substrate through an exposure with the set focus amount and the set exposure dose, the plural sets having different focus amounts and/or different exposure doses, an obtaining step of obtaining second image information of a pattern formed on the substrate through another exposure, and a selecting step of finding a correlation value between the second image information obtained in the obtaining step and the first image information in the plural sets stored in the storing step, and of selecting at least two sets having two highest correlation values among the plural sets.

8 Claims, 11 Drawing Sheets

PRIOR ART

FIG. 9A

PRIOR ART

CALCULATION METHOD AND APPARATUS OF EXPOSURE CONDITION, AND EXPOSURE APPARATUS

BACKGROUND OF THE INVENTION

1. Field of the Invention

The present invention relates to a method and apparatus for calculating an exposure condition, such as at least one of a focus amount and an exposure dose, for an exposure apparatus.

2. Description of the Related Art

A conventional projection exposure apparatus projects a reticle (mask) pattern onto a substrate in manufacturing a device using the photolithography process. The recent fine patterning requires highly precise control over a focus amount and an exposure dose to realize a given resist pattern shape.

A conditioning process sets an exposure condition before a wafer used for a mass production is actually exposed. The conditioning process measures and stores in a focus exposure matrix ("FEM") table a resist pattern for each shot on a wafer exposed by changing a focus amount (which is a wafer's position in the optical axis direction of the projection optical system in the exposure apparatus) and an exposure dose for each shot on the wafer. The conditioning process can set an exposure condition with a large margin, and expose a wafer in a mass production stage under the set exposure condition.

However, a given resist pattern may not be obtained under the condition set by the conditioning process due to various process variations. The process variations contain a resist's photosensitive sensitivity change, a thickness variation of an antireflection film under the resist, and drifts of various sensors in the exposure apparatus. Accordingly, a recently proposed measurement apparatus, such as WO2002-029870 recognizes a variation, and specifies a cause by controlling the defocus amount and the exposure dose of the exposure apparatus. This measurement apparatus photographs, through an image pickup device, a mark that is formed by exposing and developing a wafer, and detects the exposure dose or the focus amount when the mark is formed.

Figure 9A:
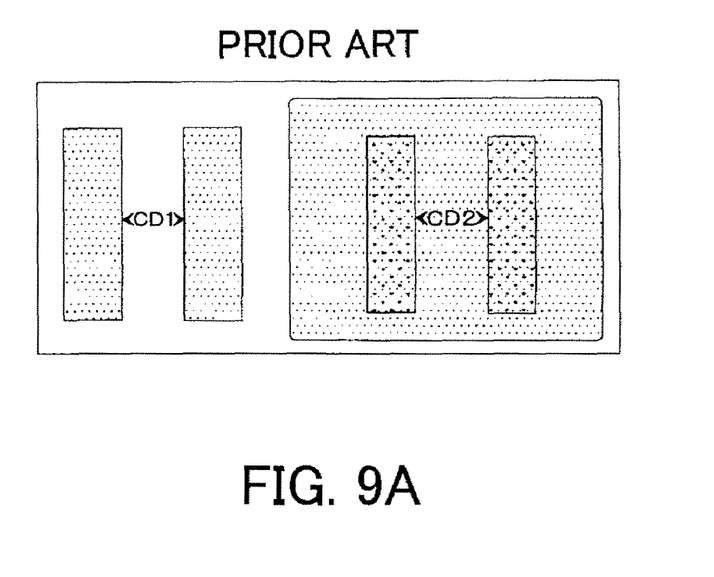
FIG. 9A is a plane view of a mark used for the conventional measurement apparatus.
Figure 9B:
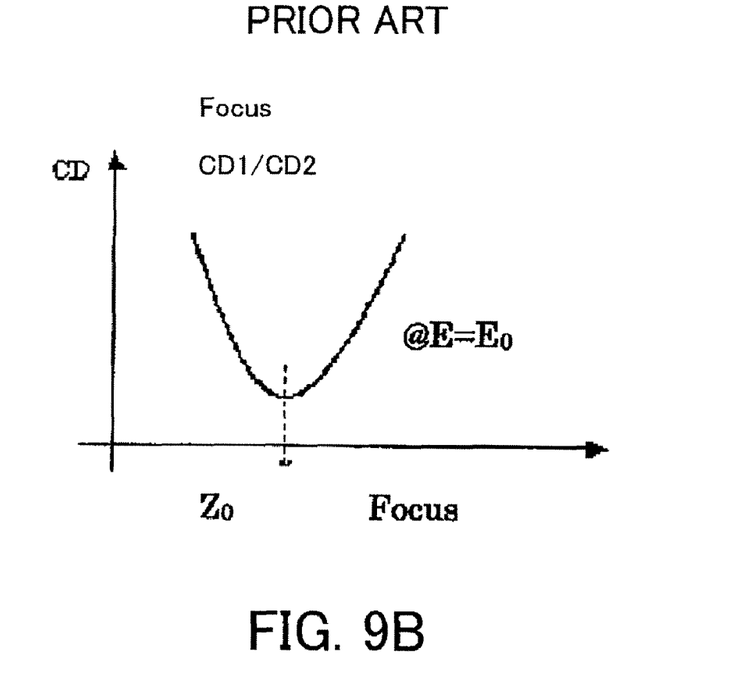
FIG. 9B is a graph showing a relationship between focus and an interval used for the measurement apparatus shown in FIG. 9A.

The conventional measuring apparatus uses two types of special grating marks shown in FIG. 9A, and measures their intervals CD1 and CD2. According to the measurement apparatus, each mark interval becomes minimum at the best focus position, and the focus amount is estimated using a characteristic (i.e., a graph shown in FIG. 9B) in which a critical dimension ("CD") varies in an even function manner relative to a defocus amount. As understood from the graph shown in FIG. 9B, the measurement apparatus can estimate an absolute defocus value but cannot estimate its shift direction. In addition, use of a special mark complicates a detection and increases the cost.

BRIEF SUMMARY OF THE INVENTION

The present invention is directed to a method and apparatus, which can comparatively easily calculate an exposure condition, such as at least one of a focus amount and an exposure dose, and an exposure apparatus that includes the calculation apparatus.

A method for calculating a correction amount to a focus amount or an exposure dose in exposing a substrate with an exposure apparatus includes a storing step of storing plural sets, each of which is a combination of a set focus amount, a set exposure dose, and first image information of a pattern formed on the substrate through an exposure with the set focus amount and the set exposure dose, the plural sets having different focus amounts and/or different exposure doses, an obtaining step of obtaining second image information of a pattern formed on the substrate through another exposure, a selecting step of finding a correlation value between the second image information obtained in the obtaining step and the first image information in the plural sets stored in the storing step, and of selecting at least two sets having two highest correlation values among the plural sets, and a calculating step of calculating the correction amount using the at least two sets of focus amounts or the exposure doses selected by the selecting step.

Further features of the present invention will become apparent from the following description of exemplary embodiments with reference to the attached drawings.

DESCRIPTION OF THE EMBODIMENTS

Figure 1A:
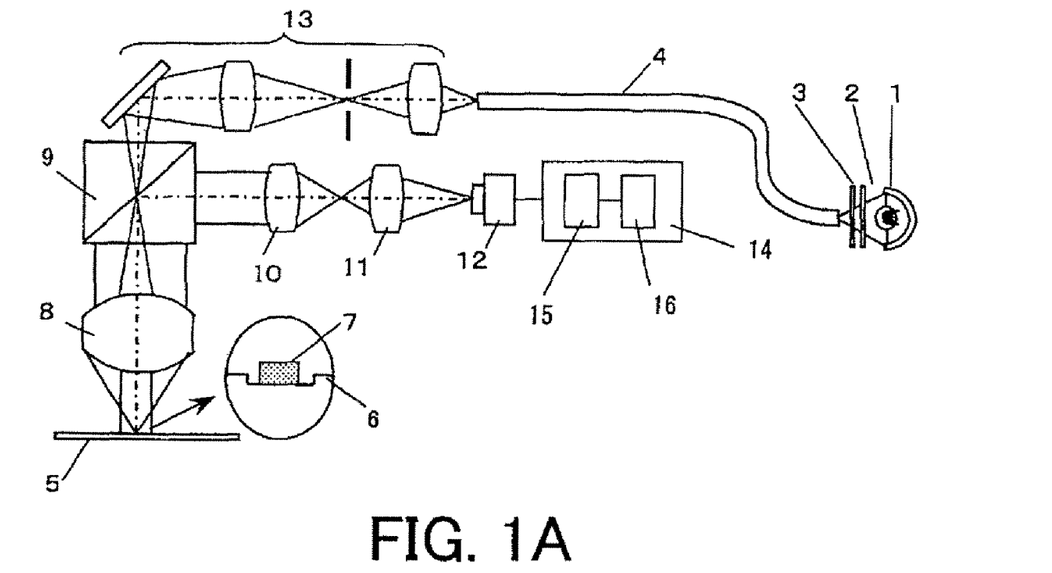
FIG. 1A is a schematic block diagram of a calculation apparatus according to this embodiment.
Figure 1B:
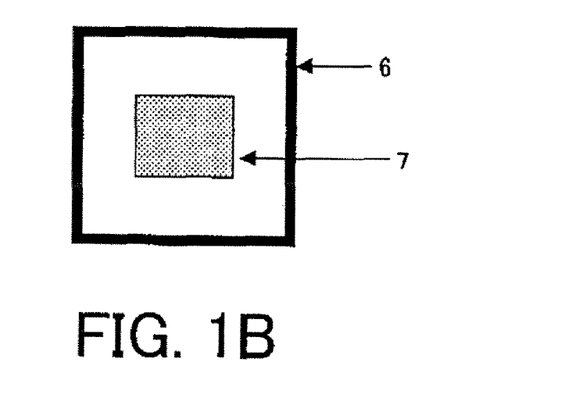
FIG. 1B is a schematic plane view of a mark used for the calculation apparatus shown in FIG. 1A.
Figure 1C:
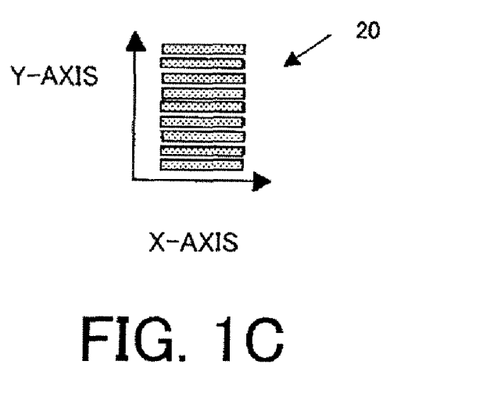
FIGS. 1C and 1D are schematic plane views of a preferable mark used to calculate a focus amount and/or an exposure dose by the calculation apparatus shown in FIG. 1A.
Figure 1D:
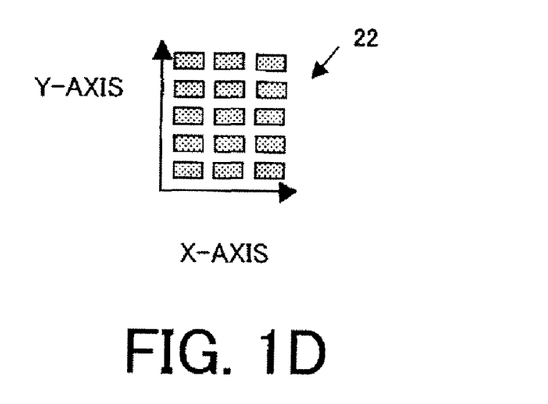

Referring now to the accompanying drawings, a description will be given of a calculation method and apparatus according to one aspect of the present invention. FIG. 1A is a schematic block diagram of an apparatus ("calculation apparatus" hereinafter) that calculates a focus amount or an exposure dose ("exposure condition" hereinafter). The focus amount is a wafer's position in an optical axis direction of the projection optical system, and the exposure dose is a light quantity on the wafer. This calculation apparatus is also used to evaluate the alignment accuracy, to calculate an offset, and to measure the distortion. The calculation apparatus measures a relative position between two separate marks (i.e., marks 6 and 7). As described later, in calculating the exposure condition, the calculation apparatus uses marks 20 and 22 shown in FIGS. 1C and 1D. Here, FIGS. 1B-1D are schematic plane views of the marks 6, 7, 20, and 22.

The light source 1 uses a halogen lamp etc., and selects a desired waveband at various optical filters 2 and 3. The light having the desired wavelength is introduced to an optical system 13 by a fiber 4, and Koehler-illuminates the marks 6 and 7 on a wafer (substrate) 5 via a beam splitter 9 and a condenser optical system 8. The light reflected from the wafer 5 passes the condenser optical system 8, the beam splitter 9, an optical system 10, and a condenser optical system 11, and forms an image on an image pickup device 12, such as a CCD camera, for photoelectric conversions. The image pickup device 12 is connected to a processing unit 14, and the processing unit 14 has a processor 15 and a memory 16. The processor 15 executes at least part of operations which will be described with reference to FIGS. 3 to 5. The memory 16 stores various data (such as a feature vector) and at least part of operation flows shown in FIGS. 3 to 5.

The processing unit 14 image-processes digital image information (image signal) generated by the image pickup device 12 (such as a CCD camera), and detects a relative position between the two marks 6 and 7. The image pickup device 12 includes an image sensor, such as a CCD sensor, a lens, an electric signal processing circuit.

The calculation apparatus utilizes a bright field illumination and image processing. In a trial calculation of a resolution of the detection system, the optical magnification is 100 nm/pixel on the wafer plane, where the magnification between the wafer 5 and the image pickup device is 100 times, and the image sensor has a pixel pitch of 10 μm.

A mark used to calculate the exposure condition is preferably a cyclically arranged pattern, as shown in FIGS. 1C and 1D, which is referred to as a "repetitive pattern" or a "pattern having a carrier frequency." This embodiment does not limit the mark used to calculate the exposure condition to the repetitive pattern, but the repetitive pattern has the redundant information and thus is expected to improve the precision due to the averaging effect. FIG. 1C is a one-dimensional repetitive pattern that is cyclically arranged in the Y-axis direction. FIG. 1D is a two-dimensional repetitive pattern that is cyclically arrange in the XY-axes directions.

An image of the mark used to calculate the exposure condition is preferably arranged in the shot or an area ("exposure area" hereinafter) in which a pattern of a mask or original is actually exposed. The conventional mark image is not arranged in the exposure area, and a special mark image is arranged between adjacent shots or on a scribe line. However, strictly speaking, the scribe line and the shots do not have the same height, and an error occurs, for example, in a focus amount, and the measurement precision deteriorates. This embodiment maintains the measurement precision by arranging the mark image in the exposure area. When the calculation apparatus detects a parameter other than the focus amount and the exposure dose, such as an alignment state, the alignment mark position does not have to be located in the exposure area.

Figure 2:
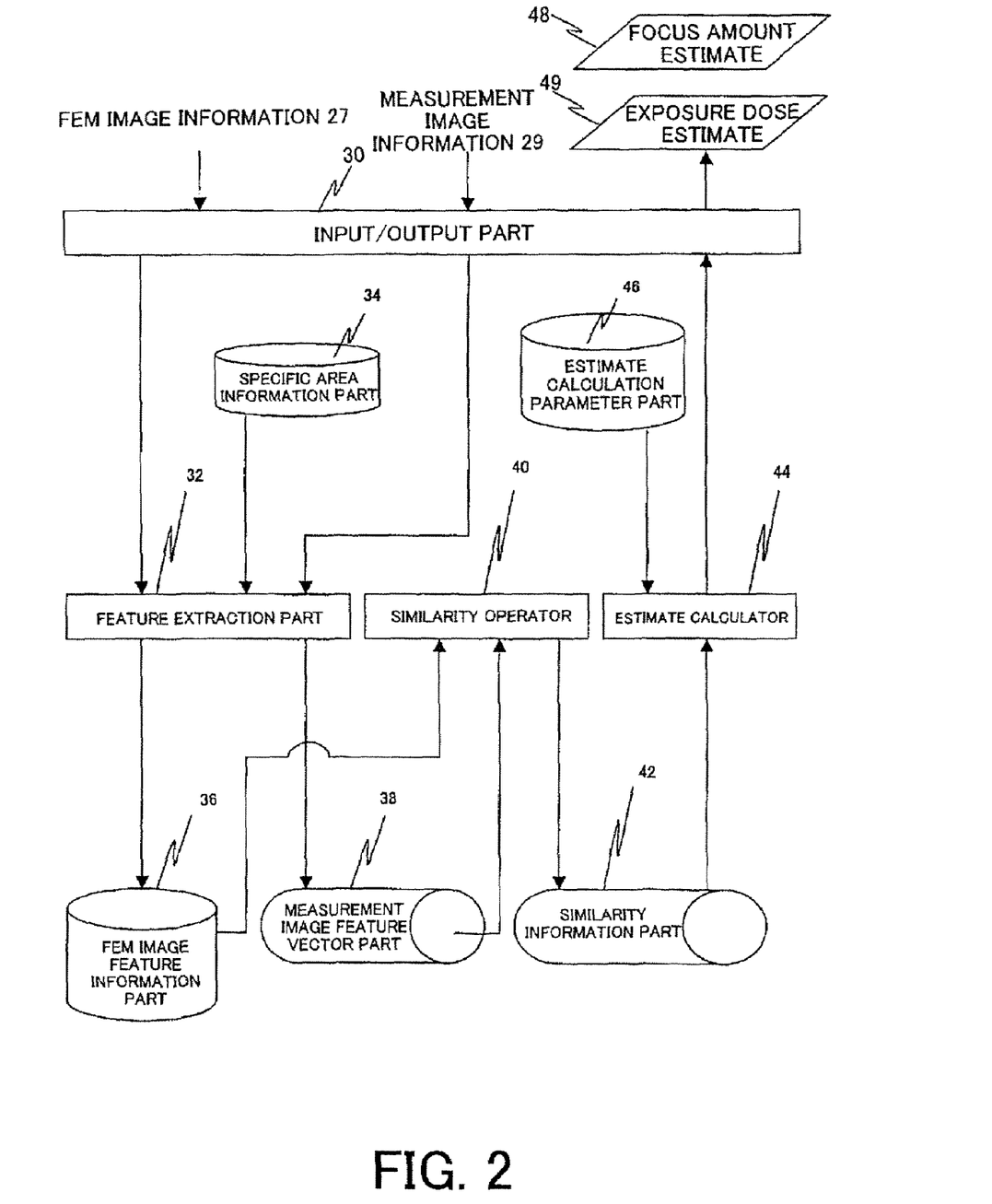
FIG. 2 is a schematic block diagram showing details of a processing unit in the calculation apparatus shown in FIG. 1A.

Referring now to FIG. 2, a description will be given of the details of the processing unit 14 used to calculate the exposure condition. Here, FIG. 2 is a schematic block diagram of the processing unit 14.

The processing unit 14 exposes the wafer by varying settings of the focus amount and the exposure dose, and previously learns the FEM image information as the image information of the pattern formed on the wafer. After learning, it outputs an estimate of the exposure condition when receiving a measured image (measurement image) of the pattern formed on the wafer that is exposed under a predetermined exposure condition. In FIG. 2, an estimate of the exposure condition is a focus amount estimate 48 or an exposure dose estimate 49, and both may be output together or may contain another exposure condition. A description will now be given of the FEM image information 27. Initially, after an image of the mark 20 shown in FIG. 1C or the mark 22 shown in FIG. 1D is exposed on the wafer under a known exposure condition (exposure dose and focus amount), an image (resist pattern) obtained through the development is taken by the image sensor. The image information will be referred to as first image information. Then, the exposure dose or focus amount is shifted, and a resist pattern obtained through the exposure with the shifted exposure dose or focus amount and the development is photographed. The image information (first digital image information) that is obtained by repeating exposures with shifted exposure doses and focus amounts and taking the resist patters of each exposure dose or focus amount. The plural pieces of obtained image information will be referred to as the FEM image information. The measurement image information (second digital image information) 29 corresponds to images of the mark 20 or 22, which are exposed under the unknown exposure condition that is a target to be estimated and measured by the image pickup device, as will be described later. The exposure is another exposure different from the exposure used to obtain the FEM image.

The processing unit 14 of this embodiment initially stores the FEM image information 27 while correlating it with the exposure condition. Next, the processing unit 14 calculates an exposure condition corresponding to the measurement image information 29 through matching of the measurement image information 29 with image information using the FME image information 27 as a template. Conventionally, mark intervals CD1 and CD2 shown in FIG. 9A are obtained, CD1/CD2 is calculated, and substituted for the previously found graph shown in FIG. 9B. On the other hand, this embodiment uses the template matching. The template matching has a higher precision than use of a mark interval.

The template matching checks a correlation of an overlap portion between the FEM image as the template and the measurement image. In the matching, the template is scanned on the measurement image, the similarity of the overlap portion is calculated, and a position that provides maximum is specified. When the measurement image completely accords with the template (i.e., when the similarity is 1), the focus value and/or the exposure dose of the template (FEM image) are output as the focus value and/or exposure dose. Usually, they do not completely accord with each other. The exposure condition of the measurement image is in the intermediate state among the plural, discretely obtained and stored, FEM images and exposure conditions, for example, between the first focus value and the second focus value. This intermediate exposure condition can be calculated by using contribution of the similarity of each focus value.

In calculating the similarity, the measurement image can be used as it is, but use of a feature portion of the measurement image would be able to improve the measurement precision. For example, the feature portion contains information of the differentiated measurement image, information of a power spectrum of a Fourier transformation relating to the measurement image, information of a specific area of the mark, and a combination of them.

Figure 10A:
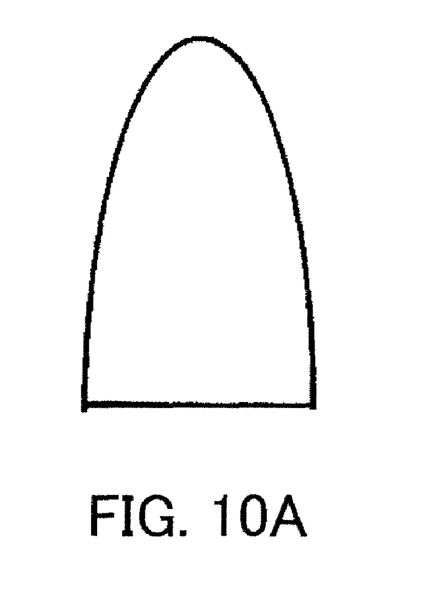
FIG. 10A is a resist sectional view when focus shifts from the best focus position in a plus direction.
Figure 10B:
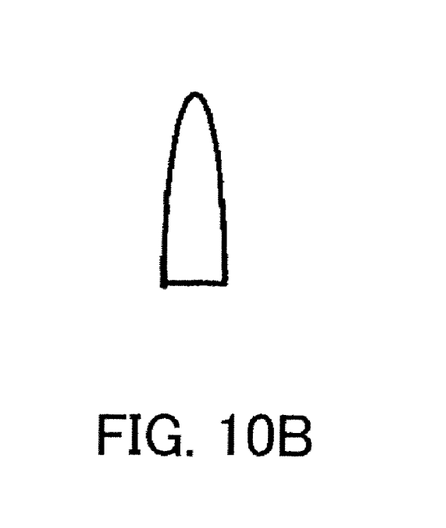
FIG. 10B is a resist sectional view when a defocus amount is equal to that of FIG. 10A, but the exposure dose is greater than that of FIG. 10A.
Figure 11A:
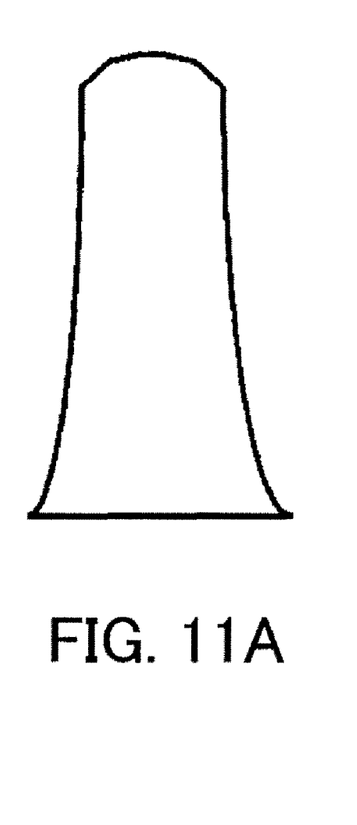
FIG. 11A is a resist sectional view when focus shifts from the best focus position in a minus direction.
Figure 11B:
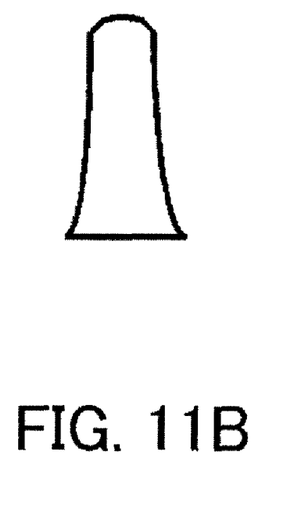
FIG. 11B is a resist sectional view when a defocus amount is equal to that of FIG. 11A, but the exposure dose is greater than that of FIG. 11A.

A description will now be given of information of the differentiated measurement image. As disclosed in KLA- Tencor, Yield Management Solutions, Fall 2001 and KLA-Tencor, Yield Management Solutions, Winter 2002, a sectional shape of the resist that shifts from the best focus position in the plus direction differs from that in the minus direction. As a defocus amount increases, this difference becomes conspicuous. FIGS. 10A and 11A show sectional shapes of the resist patterns that have the same absolute defocus value but defocuses from the best focus position in the plus direction and in the minus direction. The sectional shape of the resist pattern shown in FIG. 10A that shifts in the plus direction is different in contour and height from the sectional shape of the resist pattern shown in FIG. 11A that shifts in the minus direction. Similarly, the exposure dose makes different the sectional shape of the resist pattern, and as a difference from the best exposure dose increases, this tendency becomes conspicuous. FIG. 10B shows a sectional shape of the resist pattern when the defocus amount is equal to that of FIG. 10A but the exposure dose is greater than that of FIG. 10A. FIG. 11B shows a sectional shape of the resist pattern when the defocus amount is equal to that of FIG. 11A but the exposure dose is greater than that of FIG. 11A. It is thus understood that the sectional shape of the resist pattern differs due to the focus amount and the exposure dose. Even when the shift amount from the best position is the same, the differentiated value is different between the plus direction and the minus direction. The shift directions from the best focus position and the best exposure dose can be identified by utilizing information that is made by differentiating the image information of the sidewall of the resist pattern.

The information of the power spectrum of the Fourier transformation relating to the measurement image has an effect similar to an image, but has an advantage in that no fine positioning is necessary for the matching between two images. When the power spectrum and the differentiation information are combined, only a sidewall change of the resist pattern can be taken out through the differentiation, and then a CD change can also be taken out by frequency-separating a waveform of the sidewall change extracted by the differentiation.

It is more effective to address information of a characteristic specific area of the mark.

The processing unit 14 of the first embodiment includes an input/output part 30, a feature extraction part 32, a specific area information part 34, an FEM image feature information part 36, a measurement image feature vector 38, a similarity operator 40, a similarity information part 42, an estimate calculator 44, and an estimate calculation parameter part 46. These components may be integrated with the processor 15 and the memory 16 shown in FIG. 1A, or may be configured as separate hardware or software. More specifically, one or more of the feature extraction part 32, the similarity operator 40, the estimate calculator 44 may be integrated with the processor 15. One or more of the specific area information part 34, the FEM image feature information part 36, the measurement image feature vector part 38, the similarity information part 42, and the estimate calculation parameter part 46 may be integrated with the memory 16.

The input/output part 30 receives the FEM image information (first image information) 27 and the measurement image information (second image information) 29, and outputs an estimate of the exposure condition corresponding to the calculated measurement image information 29 (such as a focus amount estimate 48 and/or the exposure dose estimate 49). The input/output part 30 is connected to the feature extraction part 32, the estimate calculation part 44, and the similarity operator 40. The input/output part 30 receives the measurement image information 29 from the image pickup device 12 in the calculation apparatus shown in FIG. 1A, but may receive the FEM image information 27 from the image pickup device 12 or another device.

The feature extraction part 32 receives the FEM image information 27 or the measurement image information 29 from the input/output part 30. In case of the FEM image information 27, the feature extraction part 32 extracts a feature vector in a target range with the focus amount and the exposure dose using a frequency range registered in the specific area information part 34. The feature vector is a target of a correlation in the template matching, and are a column (X-axis direction) vector or a row (Y-axis direction) vector or a two-dimensional vector having an element of a frequency spectrum in a specific area when the image data of the measured pattern is expressed as a matrix.

The feature extraction part 32 extracts a feature vector in a target range from the measurement image information 29 using a frequency range registered in the specific area information part 34. This embodiment extracts a feature of a sectional shape of a resist pattern in an X-axis and/or Y-axis or two-dimensional direction. The feature extraction part 32 is connected to the input/output part 30, the specific area information part 34, the FEM image feature information part 36, and the measurement image feature vector part 38.

The FEM image feature information part 36 stores the feature vector for each image of the FEM image information 27 together with the focus amount and the exposure dose. The measurement image feature vector part 38 stores a feature vector of the measurement image information 29.

The similarity operator 40 calculates the similarity between the feature vector of the measurement image and the feature vector of each FEM image. In that case, the similarity operator 40 uses a feature vector of the measurement image stored in the measurement image feature vector part 38 and a feature vector for each FEM image stored in the FEM image feature information part 36. The similarity operator 40 is connected to the FEM image feature information part 36, the measurement image feature vector part 38, and the similarity information part 42.

The similarity information part 42 stores the similarity calculated by the similarity operator 40, and the focus amount and the exposure dose for each FEM image.

The estimate calculator 44 outputs the focus amount estimate 48 of the measurement image, or the exposure dose estimate 49 to the input/output part 30. In this case, the estimate calculator 44 utilizes the similarity information stored in the similarity information 42 and the number of high order similarities used for estimate operations registered in the estimate calculation parameter part 46. The estimate controller 44 is connected to the input/output part 30, the similarity information part 42, and the estimate calculation parameter part 46.

Figure 3:
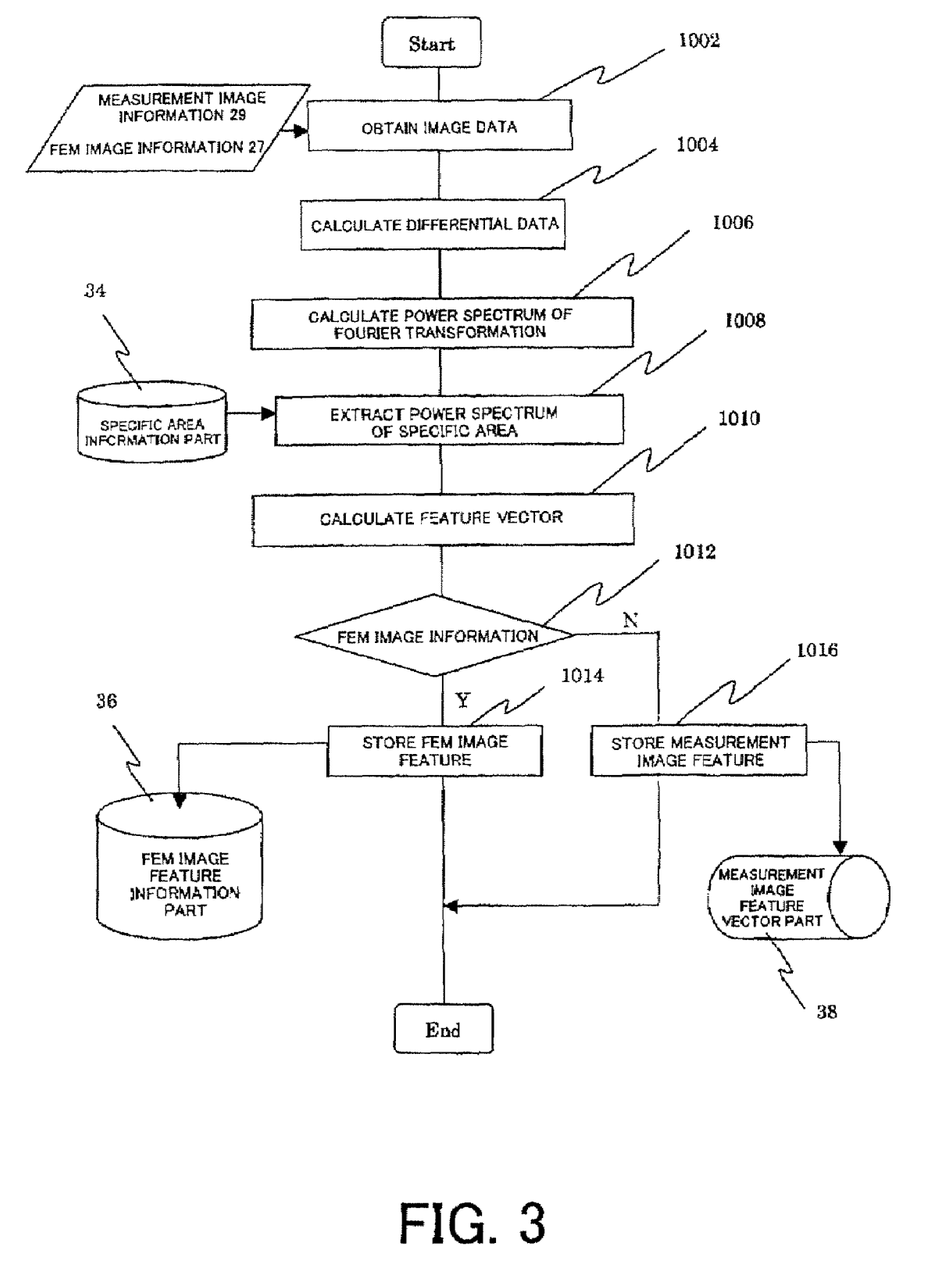
FIG. 3 is a flowchart for explaining an operation of a feature extraction part of the processing unit shown in FIG. 2.

Referring now to FIG. 3, a description will be given of an operation of the feature extraction part 32. First, data of the FEM image information 27 or the measurement image information 29 is taken out (step 1002). Next, one-dimensional differentiation data in the X-axis direction is calculated from the image data taken out by the step 1002 (step 1004). Of course, as discussed above, when the one-dimensional differentiation data in the Y-axis direction may be used instead of the one-dimensional differentiation data in the X-axis direction, the feature of the sectional shape of the resist pattern in the Y-axis direction can be extracted. In addition, both the one-dimensional feature data in the X-axis direction and the one-dimensional feature data in the Y-axis direction may be used. Use of the two-dimensional differentiation data can extract a feature of the sectional shape of the resist in the two-dimensional direction.

Next, the data calculated by the step 1004 is Fourier-transformed, and the power spectrum vector is calculated (step 1006). Next, the data in a target range is extracted from the power spectrum calculated in the step 1006 using the frequency range registered in the specific area information part 34 (step 1008). Next, the data extracted by the step 1008 is converted into a vector to obtain a feature vector (step 1010).

Next, it is determined whether the data obtained by the step 1002 is to be stored as the FEM image (step 1012). When the data is determined to be the FEM image (step 1012), the feature vector of the FEM image, the focus amount and the exposure dose of the exposure apparatus corresponding to the FEM image are stored in the FEM image feature information part 36 (step 1014). When the data obtained by the step 1002 is determined to be the measurement data (step 1012), a feature vector of the measurement image is stored in the measurement image feature information part 38 (step 1016).

Figure 4:
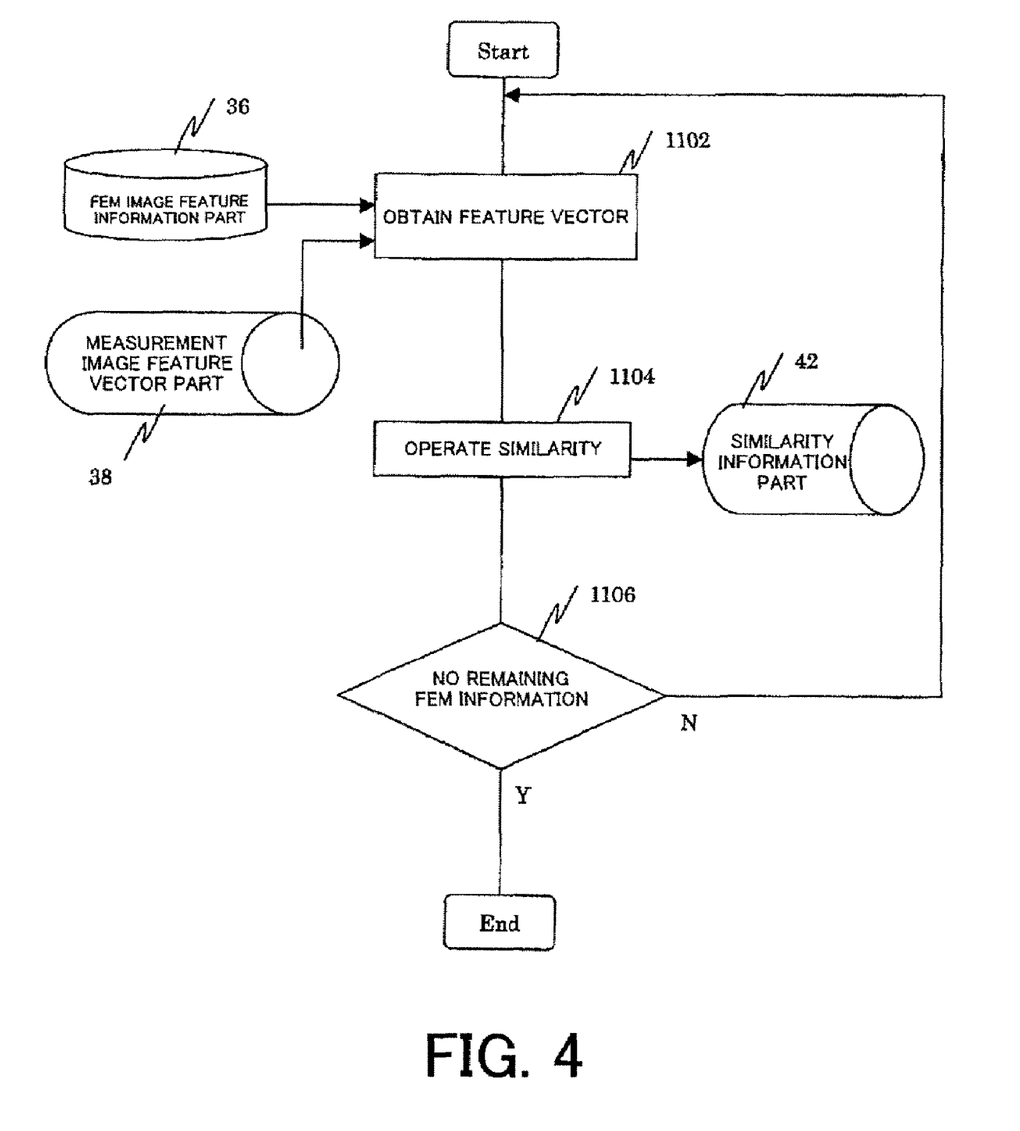
FIG. 4 is a flowchart for explaining an operation of a similarity operator in the processing unit shown in FIG. 2.

Referring now to FIG. 4, a description will be given of an operation of the similarity operator 40. Initially, the feature vector of the FEM image is obtained from the FEM image feature information part 36, and the feature vector of the measurement image is obtained from the measurement image feature vector part 38 (step 1102). Next, a normalized correlation value or a vector correlation value of each feature vector is calculated, and stored in the similarity information part 42 in addition to the focus amount and exposure dose as part of the FEM image information 27 (step 1104). Next, after similarities (correlation values) between all the FEM images and the measurement images are calculated, the procedure ends (step 1106). Otherwise, the procedure returns to the step 1102.

Figure 5:
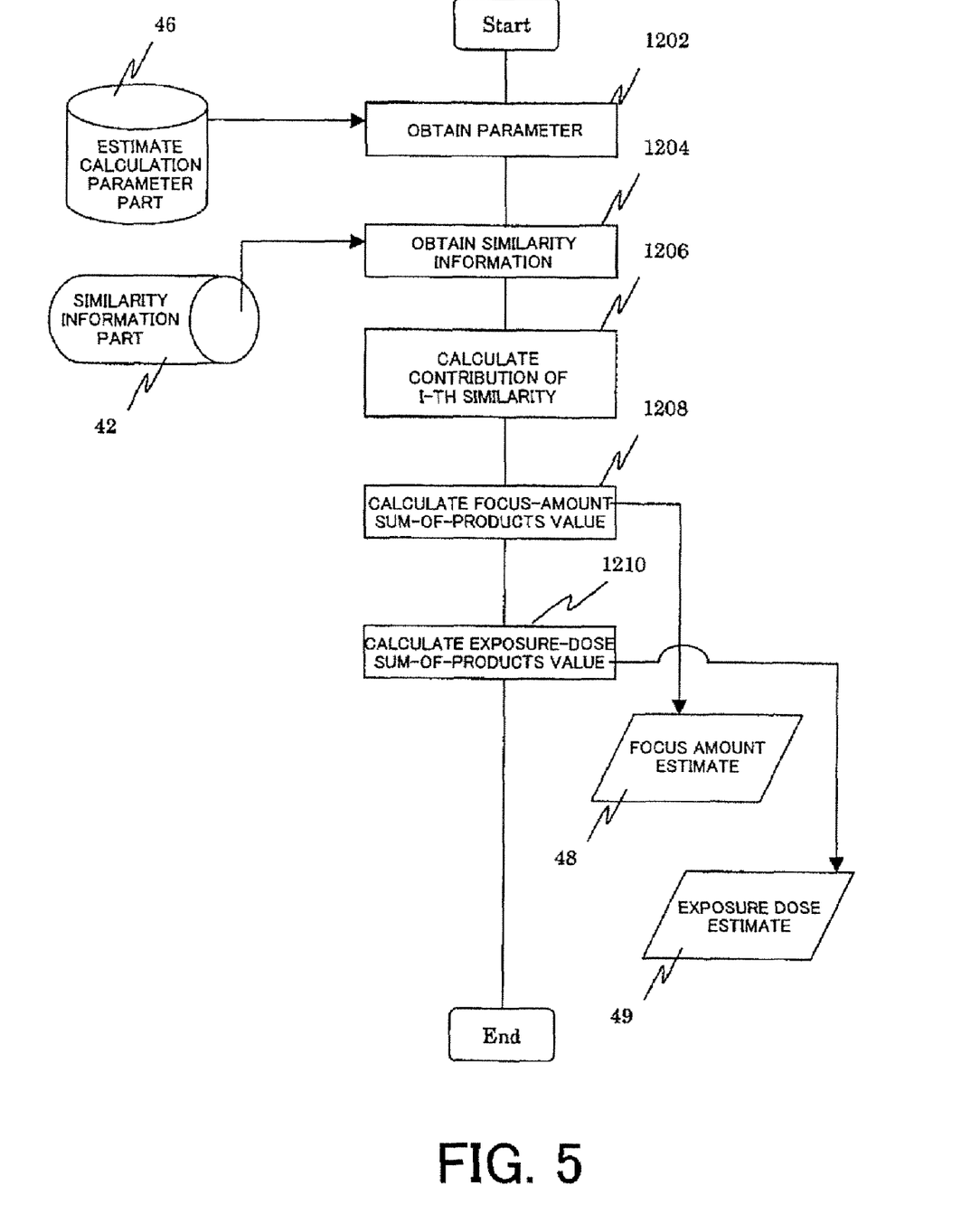
FIG. 5 is a flowchart for explaining an operation of an estimate operator in the processing unit shown in FIG. 2.

Referring now FIG. 5, a description will be given of an operation of the estimate calculator 44. Initially, the number i of high order similarities is acquired which is used for estimate operations registered in the estimate calculation parameter part 46 (step 1202). Next follows an acquisition of the similarity with the focus amount and the exposure dose stored in the similarity information part 42 (step 1204).

Next, a sum $\Sigma Corr_i$ from the first high order to the i-th order and the contribution $$\frac{Corr_i}{\Sigma Corr_i}$$

of the i-th similarity are calculated using the number i of high order similarities obtained in the step 1202 where $Corr_i$ is the i-th high order similarity obtained in the step 1204 (step 1206). Next, a focus amount $Focus_i$ and the focus-amount sum-of-products value $$\sum \left( Focus_i \frac{Corr_i}{\Sigma Corr_i} \right)$$

corresponding to the number i of high order similarities are calculated (step 1208). The focus amount calculated by the step 1208 is output as the focus estimate 48. The focus estimate 48 is used as a correction amount to correct a shift of the focus amount. Similarly, an exposure dose $Dose_i$ and an exposure-dose sum-of-products value $$\sum \left( Dose_i \frac{Corr_i}{\Sigma Corr_i} \right)$$

corresponding to the number i of high order similarities are calculated (step 1210). The exposure dose calculated by the step 1210 is output as the exposure dose estimate 49. The exposure dose estimate 49 used as a correction amount to correct a shift of the exposure dose.

Figure 6:
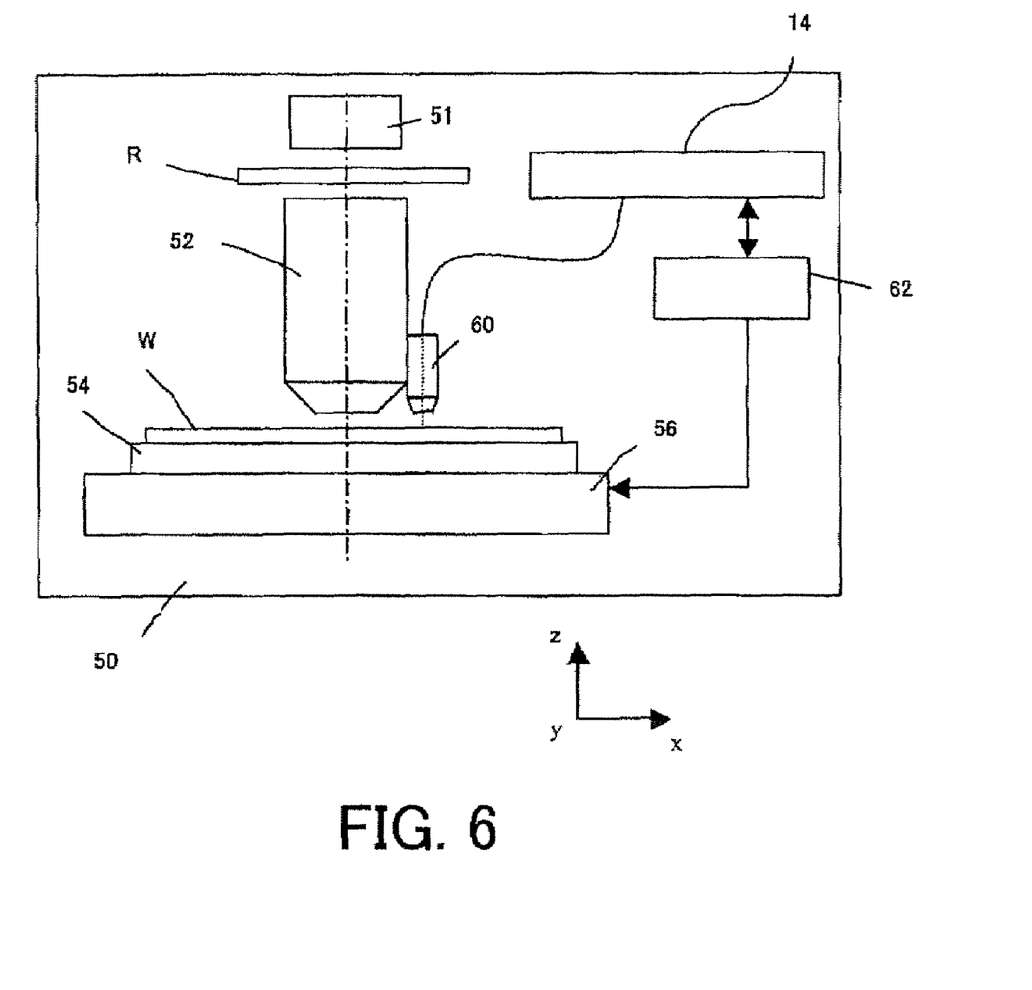
FIG. 6 is a schematic block diagram of an exposure apparatus equipped with the calculation apparatus shown in FIG. 1A.

A description will now be given of an exposure apparatus having the above calculation apparatus. FIG. 6 is a schematic block diagram of a principal part of an exposure apparatus 50. The exposure apparatus 50 includes an illumination optical system 51, a projection optical system 52, a wafer chuck 54, a wafer stage 56, a calculation apparatus 60, and a CPU 62.

The illumination optical system 51 illuminates the reticle R using the light from a light source. The projection optical system 52 projects an image of a pattern of an original or reticle R onto a resist on a wafer W. The wafer chuck 54 holds a wafer W having a primary coat latter and an alignment mark in the previous step. The wafer stage 56 positions the wafer W at a predetermined position. The calculation apparatus of this embodiment serves to calculate at least one of the focus amount and the exposure dose, but also to evaluate the alignment state. In addition, the calculation apparatus 60 is configured similar to that shown in FIG. 1, but conveniently contains part of the processing unit 14. The processing unit 14 is thus part of the calculation apparatus. When the calculation apparatus detects an alignment mark, the alignment mark is processed by the processing unit 14 and the CPU 62 controls the wafer stage 56 based on the alignment state.

This embodiment can provide the above calculation apparatus to the semiconductor exposure apparatus, and correct the exposure dose and the focus value and reduce their variations even when the resist pattern shape fluctuates.

Figure 7:
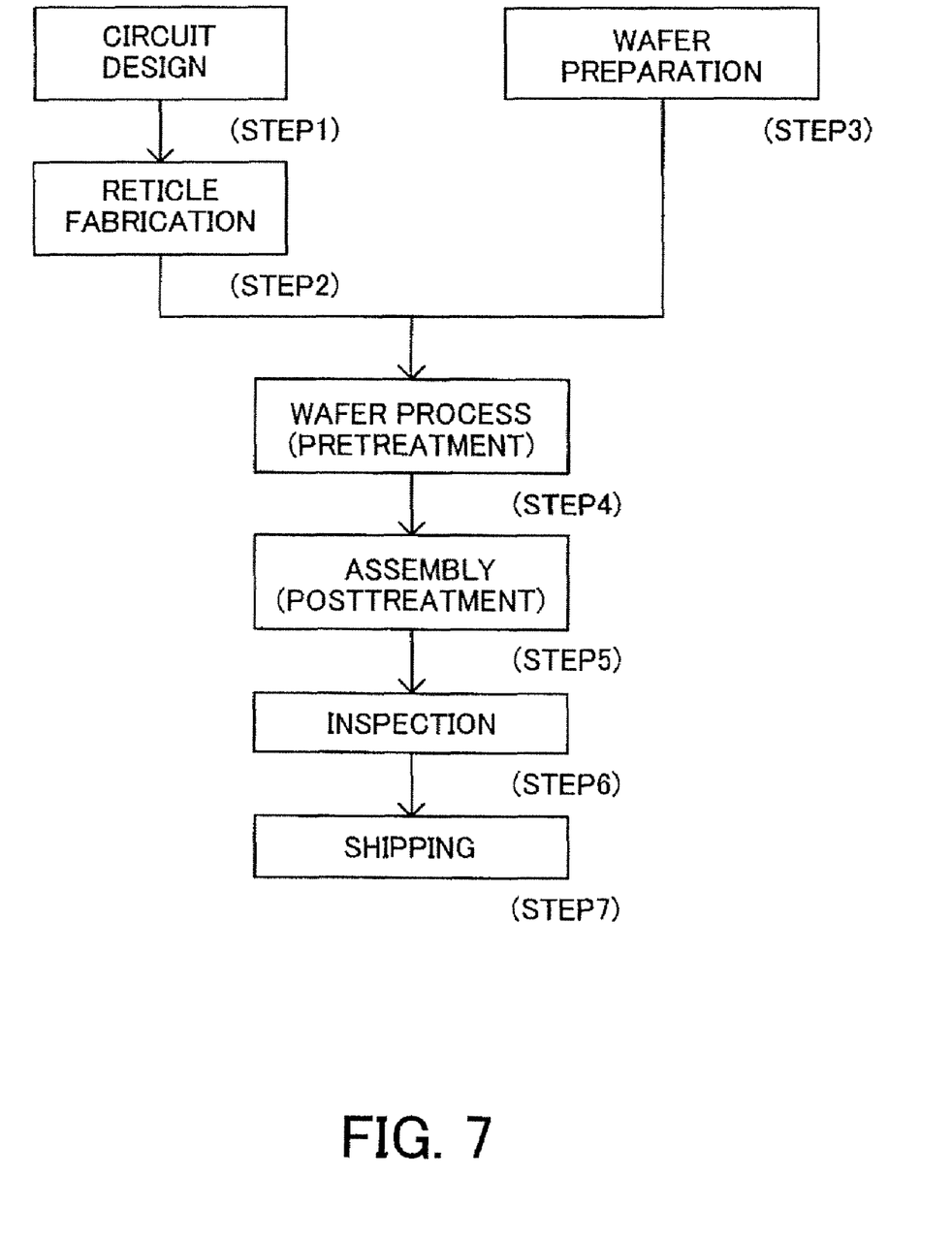
FIG. 7 is a flowchart for explaining a manufacture of a device.
Figure 8:
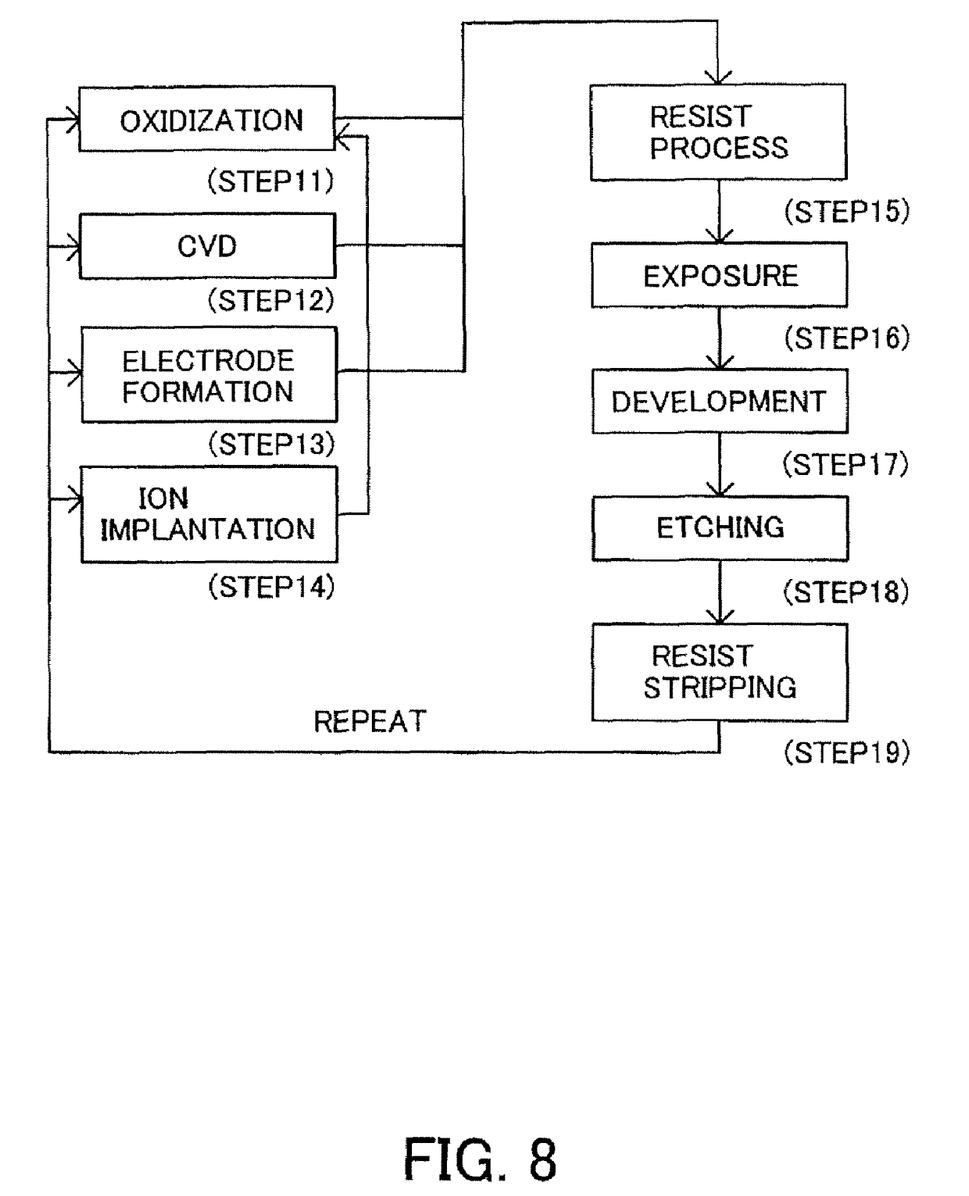
FIG. 8 is a flowchart of details of a wafer process of the step 4 shown in FIG. 7.

Referring now to FIGS. 7 and 8, a description will be given of an embodiment of a device manufacturing method using the above exposure apparatus 50. FIG. 7 is a flowchart for explaining how to fabricate devices, such as a semiconductor device and a LCD device. Here, a description will be given of a fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 8 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 50 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. Thus, the above device manufacturing method can provide a higher quality device than ever.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-147230, filed on May 26, 2006, which is hereby incorporated by reference herein in its entirety.

What is claimed is:

1. A method of exposing a substrate with an exposure apparatus, said method comprising:
   a storing step of storing in a memory, plural sets, each of which is a combination of a set focus amount, a set exposure dose, and first image information of a pattern formed on the substrate through an exposure with the set focus amount and the set exposure dose, the plural sets having different focus amounts or different exposure doses or both the different focus amounts and the different exposure doses;
   an obtaining step of obtaining second image information of a pattern formed on the substrate through another exposure;
   a selecting step of finding a correlation value between the second image information obtained in the obtaining step and the first image information in the plural sets stored in the storing step, and of selecting at least two sets having two highest correlation values among the plural sets; and
   a calculating step of calculating the correction amount using the focus amounts or the exposure doses in the at least two sets selected in the selecting step; and
   an exposure step of exposing the substrate using the correction amount calculated in the calculating step.

2. A method according to claim 1, wherein the calculating step calculates both the correction amounts to the focus amount and the exposure amount.

3. A method according to claim 1, further comprising:
   a feature extracting step of extracting a feature of each of the first image information and the second image information,
   wherein the selecting step finds the correlation value using the feature extracted by the feature extracting step.

4. A method according to claim 3, wherein the feature extracted by the feature extracting step is a one-dimensional or two-dimensional data.

5. An apparatus according to claim 3, wherein the feature is information obtained by differentiating image information or information of a power spectrum of a Fourier transformation relating to the image information.

6. A calculation apparatus configured to calculate a correction amount to a focus amount or an exposure dose in exposing a substrate with an exposure apparatus, said calculation apparatus comprising:
   an image pickup device configured to take a pattern of the substrate;
   a memory configured to store plural sets, each of which is a combination of a set focus amount, a set exposure dose, and first image information of a pattern formed on the substrate through an exposure with the set focus amount and the set exposure dose, the plural sets having different focus amounts or different exposure doses or both the different focus amounts and the different exposure doses; and
   a processor configured to find a correlation value between second image information of a pattern formed on the substrate through another exposure and the first image information in the plural sets stored in the memory, to select at least two sets having two highest correlation values among the plural sets, and to calculate the correction amount using the focus amounts or the exposure doses in the at least two sets selected.

7. An exposure apparatus comprising:
   a calculation apparatus according to claim 6;
   an illumination optical system configured to illuminate an original; and
   a projection optical system configured to project onto a substrate an image of a pattern of the original illuminated by the illumination optical system.

8. A device manufacturing method comprising the steps of:
   exposing a substrate using an exposure apparatus according to claim 7; and
   developing the substrate that has been exposed.

* * * * *